United States Patent [19]

Sorensen et al.

[11] Patent Number: 5,501,767
[45] Date of Patent: Mar. 26, 1996

[54] METHOD FOR GETTERING NOBLE METALS FROM MINERAL ACID SOLUTION

[75] Inventors: Troy Sorensen; Eric Grieger, both of Boise, Id.

[73] Assignee: Micron Technology, Inc., Boise, Id.

[21] Appl. No.: 975,789

[22] Filed: Nov. 13, 1992

[51] Int. Cl.⁶ .................................................. H01L 21/00
[52] U.S. Cl. ..................... 156/662.1; 210/681; 210/682; 134/1.3; 423/2; 423/22; 423/23; 423/87; 423/99
[58] Field of Search ................................. 423/2, 22, 23, 423/24, 25, 87, 99; 210/679, 681, 682; 156/662, 662.1; 252/79.2; 134/1.3

[56] References Cited

U.S. PATENT DOCUMENTS

| | | | |
|---|---|---|---|
| 3,766,036 | 10/1973 | McKaveney | 204/150 |
| 4,804,526 | 2/1989 | Hall et al. | 423/321 R |
| 4,952,386 | 8/1990 | Davison et al. | 423/484 |
| 5,120,443 | 6/1992 | Bruening et al. | 210/638 |
| 5,164,093 | 11/1992 | Chilton et al. | 210/688 |
| 5,277,715 | 1/1994 | Cathey | 134/2 |

Primary Examiner—Ngoclan Mai
Attorney, Agent, or Firm—Susan B. Collier

[57] ABSTRACT

Silicon is employed as a reducing agent in an acid bath to adsorb noble metals present as contaminants in the acid. In the manufacture of silicon devices for electronic memory and other devices, polonium-210 is adsorbed by silicon getters to reduce soft error rate attributable to alpha particle emissions from the radioactive polonium. The noble metals in addition to polonium which can be plated onto silicon using the disclosed method are gold, silver, platinum, copper, palladium, mercury, selenium and bismuth.

4 Claims, 3 Drawing Sheets

METHOD FOR GETTERING NOBLE METALS FROM MINERAL ACID SOLUTION

BACKGROUND OF THE INVENTION

1. Field of the Invention

This invention relates to a method of removing noble metal contaminants from a mineral acid bath, and more particularly, in the manufacturing of packaged semiconductor devices, a method for removing contaminant Po-210 from a heated phosphoric acid bath using silicon as a getter.

2. Description of the Prior Art

In the process of manufacturing large scale integrated circuits (LSI) from a silicon substrate or wafer, phosphoric acid is often used as a solution to selectively remove silicon nitride.

Phosphoric acid commonly contains trace elements of Polonium-210 (Po-210). Po-210 is a radioactive element and a source of alpha radiation emissions. Levels of Po-210 and, in proportion, alpha emissions, vary depending on the content of Po-210 in phosphorous used to make the acid solution. The Po-210 present in any deposit of phosphorous is a function of the natural decay of U-238. Po-210 Levels may vary greatly from an imperceptible emission level to significant alpha emissions.

It is well known in the industry that alpha particle emissions are one of several known causes of soft errors in LSI memory devices. Soft errors have been defined to be random, non-recurring single bit errors in memory devices. They are not permanent, i.e., no physical defects are associated with the failed bit. A bit showing a soft error is completely recovered by the following write cycle, for example, in a dynamic memory device where refresh of memory stored data occurs every several nanoseconds.

Other identified causes of soft errors are system noise, voltage marginality, sense amplifiers and pattern sensitivity, all statistical predictors of the rate at which soft errors will occur (SER).

Po-210, when present in phosphoric acid in the etching process, has been identified as a source of alpha particle emissions. Po-210 has an affinity for Silicon (Si) in the acid bath and plates onto the surface of the Si wafers which are being etched for production of finished LSI memory and other devices. The Po-210 remains bonded at surface sites on the silicon wafer, through later subsequent manufacturing steps. The finished LSI circuit or die results in a memory device with internally emitted alpha particles. The alpha particles are emitted by the Po-210 contaminating the die. Thus, the memory device becomes itself a source of contribution of SER.

SUMMARY OF THE INVENTION

Silicon is employed as a "getter" to attract Polonium 210 (Po- 210) molecules and remove them from the liquid phosphoric acid bath. Getter is used in this instance to describe silicon as the attracting agent which reacts with the noble metal, Po-210 in this example. The mechanism for this attraction is described as follows: The getter is the vehicle for removing the contaminating noble metal. Gettering refers to the act of attracting and removing the trace elements through the reduction of the trace elements onto silicon. Noble metals include silver, gold, copper, platinum, palladium, mercury, selenium and bismuth, in addition to Polonium.

In accordance with the teachings of the present invention, a method of removing noble metal trace elements from a mineral acid is disclosed, comprising the steps of heating a liquid mineral acid in a container, inserting a silicon getter into the acid in fluid contact with the acid, and removing the silicon getter from said mineral acid.

A method is set forth, wherein the liquid acid is heated to a temperature of approximately 145–150 degrees C. The mineral acid is selected from the group consisting of phosphoric acid or sulfuric acid, and any acidic solution of pH 6 or lower. The mineral acid contains at least a trace of a noble metal. The noble metal is selected from the group consisting of Polonium, gold, silver, platinum, copper, palladium, mercury, selenium and bismuth. The getter is inserted in the liquid mineral acid for at least thirty minutes.

A method of adsorbing Po-210 with a silicon getter from a phosphoric acid solution comprises the steps of providing liquid phosphoric acid in a container, heating the container of liquid phosphoric acid to between 145 degrees C. and 150 degrees C., inserting at least one silicon article into an open vessel, placing the vessel into the acid bath at least until reaching process temperature, soaking the silicon article in the liquid phosphoric acid and removing the vessel from the container.

An improved method of manufacturing electronic semiconductor integrated circuits is also disclosed. The method of substantially eliminating α-particle emissions attributable to manufacturing materials, comprises the steps of providing a quantity of phosphoric acid having at least a portion composed of Polonium-210, then heating the quantity of phosphoric acid to a temperature suitable for removal of silicon nitride from a silicon wafer, inserting a silicon getter into the phosphoric acid during or following the heating step, next removing the silicon getter from the phosphoric acid, and etching silicon nitride from a semiconductor wafer having wiring paths defined thereon.

It is therefore an object of the present invention to provide a method of eliminating alpha particle emissions from phosphoric acid while simultaneously removing Po-210 from the acid solution.

It is further an object of the present invention to provide a method of decontaminating phosphoric acid for use in the manufacture of silicon LSI memory devices.

Another object of the present invention is to provide a method of plating noble metals onto silicon from an acidic solution.

Yet another object of the present invention is to provide a method of manufacturing a LSI memory device substantially free of soft errors due to internal alpha particle radiation.

DESCRIPTION OF THE PREFERRED EMBODIMENT

Figure 2:
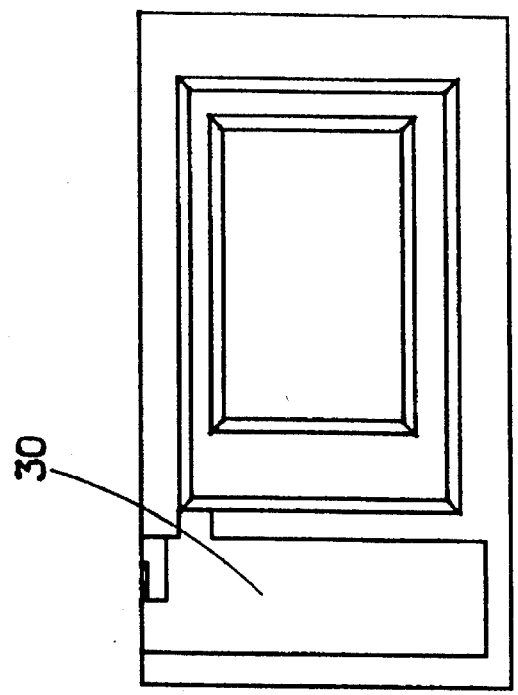
FIG. 2 illustrates the top view of FIG. 1 with a cover placed over top of the pump and filter sections.

The following experiments were devised to illustrate and to prove the effectiveness of the present invention.

EXPERIMENT NO. 1

In this experiment, a set of four circular silicon wafers measuring 6" in diameter and 675 microns in thickness were dipped in a bath of fresh phosphoric acid at 145 degrees to 150 degrees C. for thirty minutes. The first four wafers were then removed. [The term "wafer" as used in this description of this invention refers to a wafer of the type used in the manufacturer of packaged semiconductor device. The dimensions are 6" diameter circular silicon wafer of 650 to 700 micron thickness.]

The phosphoric acid bath was then gettered by dipping a batch of fifty silicon wafers for thirty minutes. The temperature was held constant at 145°–150° C. The fifty wafers used to buffer the acid bath are defined as getters. The getters were then removed.

A second group of four wafers was then dipped in the same bath for 30 minutes at the same temperature.

α-particle emissions were next measured by placing the first group of four wafers in a cloud chamber for nine hours. A reading of the cumulative α-particles counts was taken once every hour for nine consecutive hours. Measurements were made using a Spectrum Science Co. Model 850 radiation analyzer. The cloud chamber was purged. Then the second group of four wafers was placed in the cloud chamber. α-particle emissions were measured using the same procedure. The results are set forth in Table 1.

TABLE 1

| After Hour | α-Particle Emissions Group 1 before buffering | α-particle Group 2 after buffering |
|---|---|---|
| 1 | 382 | 209 |
| 2 | 707 | 400 |
| 3 | 1053 | 585 |
| 4 | 1371 | 774 |
| 5 | 1681 | 971 |
| 6 | 2007 | 1161 |
| 7 | 2312 | 1353 |
| 8 | 2617 | 1518 |
| 9 | 2919 | 1706 |
| Average Counts per wafer-hour | 77.4 | 46.6 |

EXPERIMENT NO. 2

Eight gallons of phosphoric acid was mixed in solution. Half was placed in one tank and the remainder in a second tank. The mixture was divide this way in order to ensure that the chemical reagents in each tank were identical. Both tanks were then gradually heated to 145° to 150° C., over approximately a thirty minute period.

The first tank was not treated with getter wafers before introducing the sample production wafers. Two sample production wafers were placed in the heated phosphoric acid bath for thirty minutes and then removed. α-emission measurements were made after placing the wafers in a cloud chamber. Using a Spectrum Science Model 850 radiation detector, measurements were taken at one hour intervals for nine hours. The results are listed in Table 1A.

The second tank was first gettered with fifty getter wafers. After heating to the desired process temperature above, the getter wafers were placed in a vessel and submerged in the phosphoric acid bath of tank #2. After thirty minutes elapsed, the vessel was removed. Then two sample production wafers were placed into the buffered phosphoric acid bath. Alpha emissions were then measured in the same manner as described for the first tank sample wafers. The results are listed in Table 1B.

The average counts per wafer-hour was calculated as a measure of radioactivity level for comparison purposes. The calculation is made by subtracting the 4th hour cumulative emissions from the 9th hour cumulative total, in order to eliminate any possible "background" or ambient radioactive contribution due to other sources. Radon gas is one example of ambient background radiation contribution. The difference in those two readings yields a 5-hour cumulative total α-emission which is solely attributable to contaminants in the process material—i.e.—Po-210 present in the phosphoric acid. The total is then divided by 5 to yield an average hourly emission, then divided again by two to yield a per-wafer, per hour measurement.

| After Hour No. | TABLE 1A Alpha Particle Emissions Measured (Acid Bath Not Buffered) | TABLE 1B Alpha Particle Emissions Measure (Acid Bath Buffered) |
|---|---|---|
| 1 | 149 counts | 68 counts |
| 2 | 234 | 153 |
| 3 | 346 | 224 |
| 4 | 460 | 304 |
| 5 | 565 | 368 |
| 6 | 665 | 427 |
| 7 | 772 | 501 |
| 8 | 861 | 563 |
| 9 | 950 | 635 |
| Average | 49 counts/wafer-hour | 33.1 counts/wafer hour |

This experiment reveals that emissions from sample production wafers in tank two after buffering measured approximately 65% of the emission levels of the identical wafers from tank one.

Each tank contained identical solutions of phosphoric acid, and the sample production wafers tested in each tank were selected from the same production batch.

A second part of the same experiment consisted of measuring the alpha radiation levels of the getter wafers—the group of 50 wafers used to buffer tank number two. Two wafers (No. 9 and 10) were randomly selected from this group and measured for alpha radiation using the same measurement procedure as used in the first part of this experiment. Table 2A sets forth the results of this phase of the experiment.

TABLE 2A

| After Hour No. | Alpha Emission Counts |
|---|---|
| 1 | 105 |
| 2 | 186 |
| 3 | 269 |
| 4 | 362 |
| 5 | 438 |
| 6 | 531 |
| 7 | 602 |
| 8 | 697 |
| 9 | 784 |

Consistent with the results in tables 1A and 1B, this establishes that the source of alpha emissions is gettered by the Si wafers placed in the vessel. While the Po-210 is adsorbed by fifty of the gettering wafers in a half hour soak period, it is expected that the larger number per volume of acid of getter wafers will adsorb Po-210 a rate (42.2) equal to or less than the two wafers placed in the unbuffered solution of tank No. 1(49).

EXPERIMENT NUMBER 3

In a third experiment, the effect of gettering as a function of time was determined. Results showed that the longer the silicon gettering wafers were immersed in the heated acid bath, the lower the Po-210 contamination in the acid solution after the gettering wafers are removed.

A tank of liquid phosphoric acid was heated to 145°–150° C. From a batch of fifty wafers, two were selected at random (Nos. 13 and 14). These two wafers were submerged for thirty minutes and removed, then cleaned, dried and stored in one airtight flat-pack container for a short time. Using the same measurement technique, α-particles were measured at 45.5 counts per wafer-hour.

The same acid bath at process temperature was then gettered by inserting the vessel into the bath for one hour. The vessel contained fifty gettering wafers. After one hour, the vessel was pulled from the tank and two production wafers were placed in the tank for one half hour. α-emissions for these two wafers were measured at 32.4 counts per wafer-hour.

The same acid bath was again gettered with a second batch of fifty silicon wafers for a second one hour interval. The vessel containing the getters was removed. Two production wafers were inserted in the bath for one half hour and removed. α-particle emissions were recorded as 26.6 counts per wafer hour.

By buffering the acid bath with fifty getter wafers for one hour a 28.8% reduction in α-particles was realized; after then buffering the same bath for a second hour, an overall reduction in α-particle emission of 41.5% was measured.

EXPERIMENT 4

In order to determine the relation of surface area of the silicon getter material to the efficiency of α-particle (Po-210) removal, a fourth experiment was conducted. In this experiment, a quantity of high-quality silicon beads weighing 500 grams were used instead of the 50 wafers (weight=1500 grams) as in the previous experiments. The silicon beads are spherical, so it was assumed—without measuring—that these would permit significantly greater fluid contact with the phosphoric acid.

A batch of phosphoric acid was mixed and divided into two separate tanks, then both tanks were heated to 145°–150° C. One tank was buffered with silicon getter beads for approximately four to five hours at process temperature. The second tank was not buffered at all, and remained at process temperature for the same time interval.

Five production wafers were then placed in each tank and removed after thirty minutes. The wafers were then placed in the cloud chamber. α-particles were measured again with the Spectrum Model 850 radiation analyzer. For this experiment, measurements were recorded once every hour for fifteen consecutive hours. Contribution due to background emissions were compensated by subtracting hour 4 reading from hour 15 reading. The counts per wafer hour were determined by dividing the difference by eleven (hours); and dividing again by five (wafers) [according to the same method as experiment number 1] to arrive at the comparison figures. Table 4 shows the readings for each set of wafers according to each of fifteen hours.

TABLE 4

| Hour | Unbuffered | Buffered |
|---|---|---|
| 1 | 1008 | 168 |
| 2 | 2004 | 290 |
| 3 | 2953 | 408 |
| 4 | 3879 | 514 |
| 5 | 4845 | 607 |
| 6 | 5793 | 722 |
| 7 | 6755 | 607 |
| 8 | 7682 | 722 |
| 9 | 8630 | 828 |
| 10 | 9553 | 1171 |
| 11 | 10,507 | 1282 |
| 12 | 11,459 | 1412 |
| 13 | 12,399 | 1542 |
| 14 | 13,352 | 1658 |
| 15 | 14,286 | 1768 |
| Counts per wafer-hour | 189.2 | 22.8 |

Results indicated reduction of α-particle emissions of over 80% in the silicon wafers after buffering the phosphoric acid bath compared to α-particle emissions in the silicon wafers when the acid bath was not buffered.

It should be noted that each batch of phosphoric acid may have high or low Polonium-210 content, depending on the source where the phosphorous was mixed. Thus, the magnitude of the various readings, for buffered and unbuffered results is less significant than their percentage differences.

Figure 1:
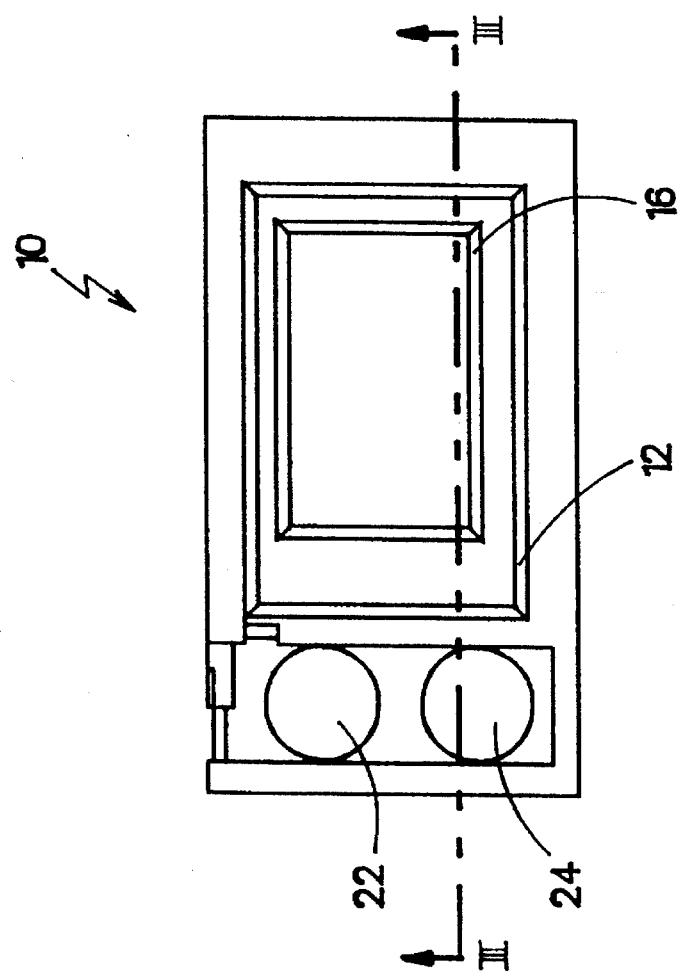
FIG. 1 illustrates a top view of the process tank placed within a reservoir tank adjacent to pump and filter.
Figure 3:
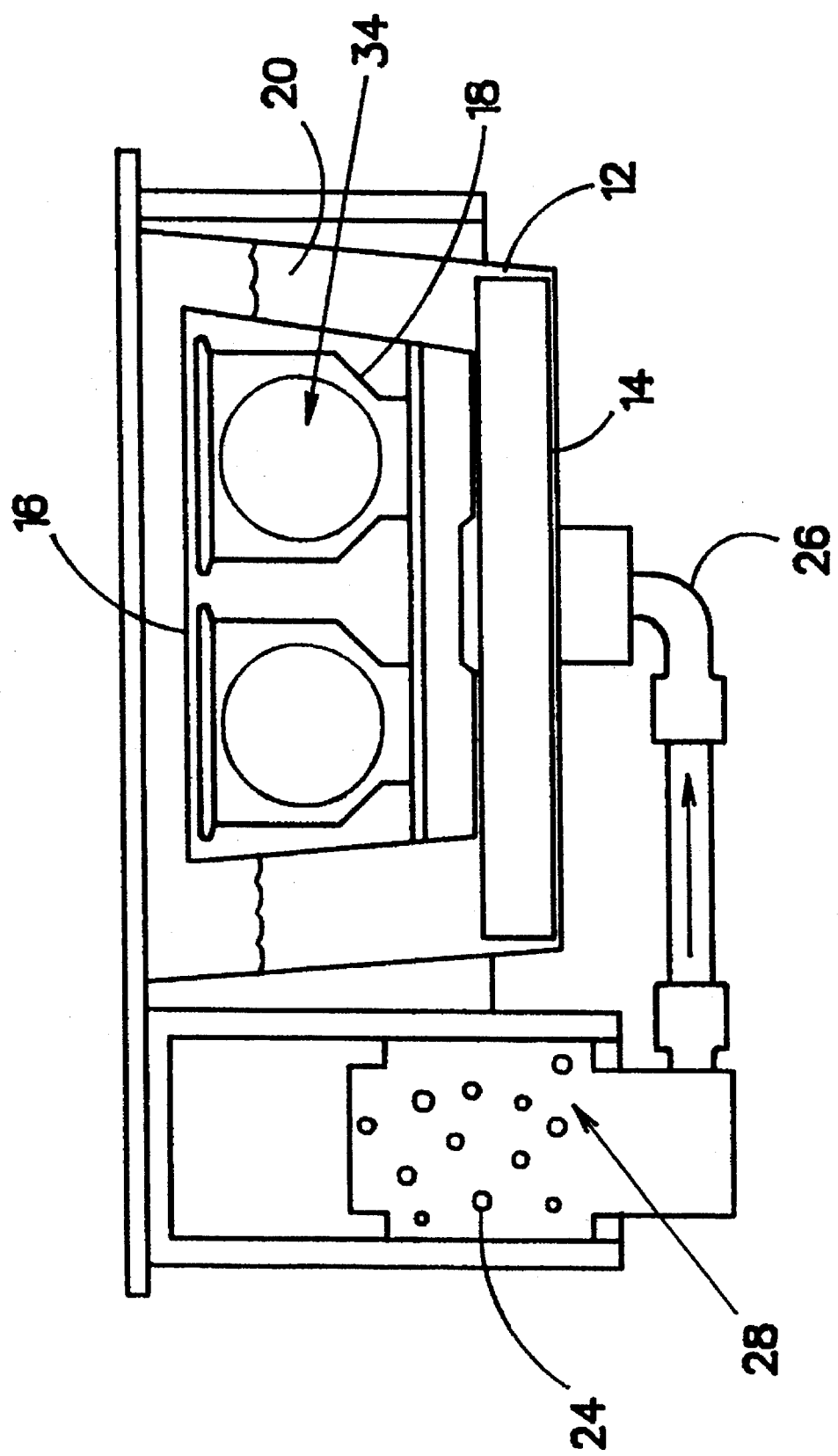
FIG. 3 is a cross-sectional profile view taken along the lines 3—3 in FIG. 1.

Referring to FIGS. 1, 2 and 3, a preferred embodiment of the present invention is shown. Recirculating bath filter system 10 includes reservoir tank 12. Heater 14 is located adjacent to the bottom of tank 12. Heater 14 may be of insertion type or immersion type. Process tank 16 fits into reservoir 12. Reservoir 12 and process tank 16 are preferably made of teflon to withstand the corrosive liquids contained within them.

Reservoir tank 12 is filled with liquid phosphoric acid 20, then heated to 145°–150° C. The process temperature ideally suited to stripping nitride from the surface of silicon when etching microscopic circuits onto silicon wafer surfaces. During the heating cycle and after, phosphoric acid 20 is circulated through silicon media 28 in filter housing 24. Pump 22 circulates acid 20 through filter housing 24 and back to reservoir 12 through conduits 26, 26A (not shown) made of teflon fittings for supply and return of acid 20.

Silicon media 28 getters po-210 from the phosphoric acid. After a predetermined interval has elapsed—usually thirty to forty-five minutes—process temperature in the bath is achieved and Pl-210 is gettered from the acid. Vessel 32 is substantially immersed in the liquid acid bath 20 by placing it into process tank 16. Vessel 32 contains silicon wafers 34 which are then cleaned and etched for manufacture of integrated circuit devices. Note the distinction between gettering wafers 36 and silicon wafers used in production of final devices.

Figure 4:
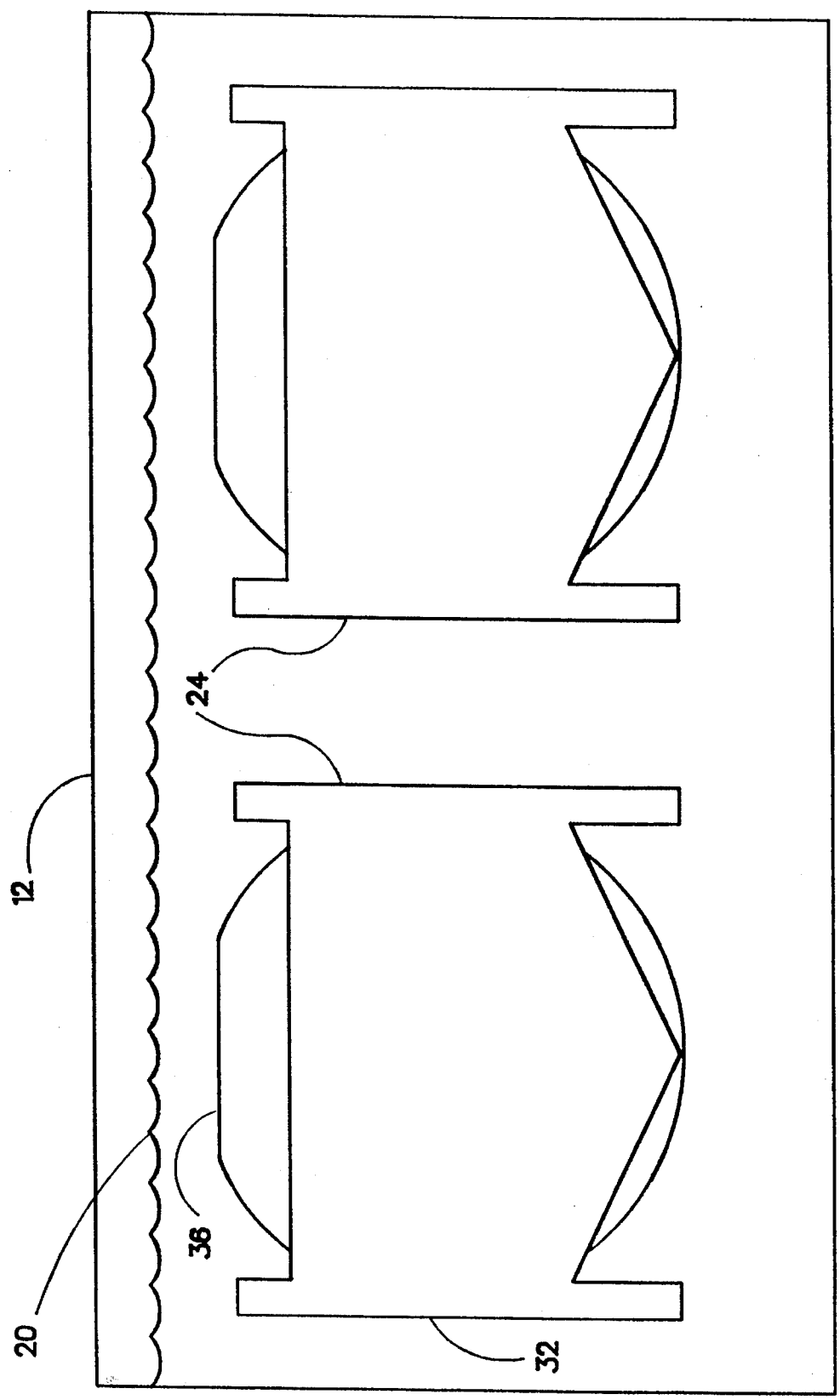
FIG. 4 is an illustration of a vessel containing silicon wafers.

Referring next to FIG. 4, vessel 32 is illustrated for use in an alternative method of gettering Po-210 from phosphoric acid. In this method, gettering wafers 36 are placed in vessel 32 then submerged in reservoir tank 12 while the bath is heated to process (145°–150° C.) temperature from ambient. This method is useful where it may be impractical or uneconomical to equip tank 12 with filter housing 24 and pump 22, and associated plumbing. Gettering wafers 36 replace silicon media 28 from filter housing 24, and are manually inserted and removed from the acid reservoir 20 to getter Po-210 before the production silicon wafers are dipped in reservoir 20. Vessels 32 are shaped like a dish rack so that the flat gettering wafers 36 may be supported vertically in a row, typically twenty five to a vessel.

As previously described, noble metals in an acidic solution will be adsorbed by—or plate onto—a reducing agent such as silicon. For substantial plating to occur, the pH of the solution must be 6 or lower. Optimal plating conditions exist in a mineral acid bath such as phosphoric or sulfuric. While heating the bath increases the rate at which noble metals are adsorbed by the reducing agent, it is not necessary to heat the acid solution in order for adsorption to occur.

Similarly, the time of exposure of the silicon reducing agent is set forth in the experiments above, as a means of illustrating effects and for measuring the effects. It should be noted that reduction of the noble metal begins immediately at room or ambient temperature, so long as the acid is liquid to allow for immersion of the reducing agent.

Depending on the quantity of acid solution one desires to decontaminate of noble metal traces, temperature and time of exposure may be increased or decreased to yield timely and efficient results. Experiments one through four above were conducted with quantities of eight gallons of phosphoric acid. The same effect will be realized on much greater scales. For example, in a large storage facility for storing acid, it may be impractical or uneconomical to heat large storage tanks. It is not necessary however to add heat where the silicon may be exposed for significantly longer intervals.

According to the provisions of the Patent Statutes, we have explained the principal, preferred construction and mode of operation of our invention and have illustrated and described what we now consider to represent its best embodiments. However, it should be understood that, within the scope of the appended claims, the invention may be practiced otherwise than as specifically illustrated and described.

We claim:

1. A method of removing at least a portion of a metal trace element selected from the group of metals consisting of polonium, gold, silver, platinum, copper, bismuth, palladium, and mercury and present in a liquid having a pH of approximately six or lower comprising the steps of heating the liquid in a container to a temperature of approximately 145° to 150° C.;

inserting a getter into said liquid in fluid contact therewith; and removing said getter from said liquid in order to remove the portion of the metal trace element from the liquid.

2. The method as set forth in claim 1, wherein said liquid is selected from the group consisting of phosphoric acid and sulfuric acid.

3. A method of using a silicon media to remove at least a portion of Po-210 from a phosphoric acid solution containing the Po-210 comprising the steps of, providing the phosphoric acid solution in a container;

heating said phosphoric acid solution to a process temperature between 145° C. and 150° C.;

inserting the silicon media into an open vessel;

placing said vessel into said phosphoric acid solution at least until said silicon media reaches the process temperature;

soaking said silicon media in said phosphoric acid solution; and removing said open vessel and the silicon media from the container in order to remove the portion of the Po-210 from the phosphoric acid solution.

4. A method of manufacturing an electronic semiconductor integrated circuit, comprising the steps of, providing a phosphoric acid solution containing Polonium-210;

heating said phosphoric acid solution to a temperature suitable for removal of silicon nitride from a silicon wafer;

inserting a getter into said phosphoric acid solution;

heating said getter to said temperature;

removing said getter from the phosphoric acid thereby removing at least a portion of Polonium-210 from said phosphoric acid solution; and etching silicon nitride from a semiconductor wafer using said phosphoric acid solution subsequent to said step of removing.

* * * * *